(12) United States Patent
Kokubun

(10) Patent No.: US 8,735,939 B2
(45) Date of Patent: May 27, 2014

(54) SOLID STATE IMAGING DEVICE

(75) Inventor: Koichi Kokubun, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 153 days.

(21) Appl. No.: 13/371,712

(22) Filed: Feb. 13, 2012

(65) Prior Publication Data
US 2012/0273837 A1 Nov. 1, 2012

(30) Foreign Application Priority Data

Apr. 26, 2011 (JP) ................... 2011-098518

(51) Int. Cl.
H01L 27/146 (2006.01)

(52) U.S. Cl.
USPC ................... 257/184; 257/E27.13

(58) Field of Classification Search
USPC ............................ 257/184, E27.13
See application file for complete search history.

(56) References Cited

U.S. PATENT DOCUMENTS

| 5,818,322 | A | 10/1998 | Tasumi | |
|---|---|---|---|---|
| 7,045,832 | B2* | 5/2006 | Tweet et al. | 257/184 |
| 7,164,182 | B2* | 1/2007 | Mouli | 257/436 |
| 7,335,958 | B2* | 2/2008 | Mouli | 257/407 |
| 7,485,904 | B2* | 2/2009 | Mouli | 257/233 |
| 7,511,354 | B2* | 3/2009 | Rhodes et al. | 257/506 |
| 7,521,737 | B2* | 4/2009 | Augusto | 257/233 |
| 7,608,192 | B2* | 10/2009 | Kim et al. | 216/13 |
| 7,635,604 | B2* | 12/2009 | Rhodes et al. | 438/48 |
| 7,732,845 | B2* | 6/2010 | Adkisson et al. | 257/292 |
| 7,847,366 | B2* | 12/2010 | Rhodes et al. | 257/506 |
| 7,872,284 | B2 | 1/2011 | Mouli | |
| 8,269,303 | B2* | 9/2012 | Fujikata et al. | 257/458 |
| 2002/0024058 | A1* | 2/2002 | Marshall et al. | 257/170 |
| 2002/0101895 | A1* | 8/2002 | Augusto | 372/44 |
| 2002/0171077 | A1* | 11/2002 | Chu et al. | 257/19 |
| 2003/0116762 | A1* | 6/2003 | Hwang et al. | 257/20 |
| 2004/0097021 | A1* | 5/2004 | Augusto et al. | 438/149 |
| 2005/0023554 | A1* | 2/2005 | Chu et al. | 257/190 |
| 2005/0133723 | A1* | 6/2005 | Lee et al. | 250/338.4 |
| 2005/0167709 | A1* | 8/2005 | Augusto | 257/292 |
| 2007/0026326 | A1* | 2/2007 | Kim et al. | 430/57.3 |
| 2007/0057298 | A1* | 3/2007 | Mouli | 257/292 |

(Continued)

FOREIGN PATENT DOCUMENTS

| JP | 8-107232 | 4/1996 |
|---|---|---|
| JP | 2007-27686 | 2/2007 |

(Continued)

Primary Examiner — Julio J Maldonado
Assistant Examiner — Jaehwan Oh
(74) Attorney, Agent, or Firm — Oblon, Spivak, McClelland, Maier & Neustadt, L.L.P.

(57) ABSTRACT

According to one embodiment, a solid state imaging device includes a photoelectric converting portion including a semiconductor region and a semiconductor film. The semiconductor region has a first region and a second region. The first region is of a second conductivity type. The first region is provided in a semiconductor substrate. The second region is of a first conductivity type. The first conductivity type is a different conductivity type from the second conductivity type. The second region is provided on the first region. The semiconductor film is of the second conductivity type. The semiconductor film is provided on the semiconductor region. An absorption coefficient of a material of the semiconductor film to a visible light is higher than an absorption coefficient of a material of the semiconductor substrate to the visible light. A thickness of the semiconductor film is smaller than a thickness of the semiconductor region.

20 Claims, 13 Drawing Sheets

(56) References Cited

U.S. PATENT DOCUMENTS

| | | |
|---|---|---|
| 2008/0070340 A1 | 3/2008 | Borrelli et al. |
| 2011/0012221 A1* | 1/2011 | Fujikata et al. ............... 257/458 |
| 2011/0059573 A1* | 3/2011 | Mouli ............................ 438/73 |
| 2012/0235271 A1* | 9/2012 | Momose ........................ 257/447 |

FOREIGN PATENT DOCUMENTS

| | | |
|---|---|---|
| JP | 2007-27730 | 2/2007 |
| JP | 2007-529103 | 10/2007 |
| JP | 2008-305994 | 12/2008 |
| JP | 2010-503991 | 2/2010 |

* cited by examiner

SOLID STATE IMAGING DEVICE

CROSS-REFERENCE TO RELATED APPLICATIONS

This application is based upon and claims the benefit of priority from Japanese Patent Application No. 2011-098518, filed on Apr. 26, 2011; the entire contents of which are incorporated herein by reference.

FIELD

Embodiments described herein relate generally to a solid state imaging device.

BACKGROUND

Currently, a PN junction diode formed of Si is a mainstream of a photodiode to be used in an image sensor, and Si has an advantage in respect of leakage characteristics or easiness of fabrication. Meanwhile, in recent years, the refinement of a pixel progresses and there is a serious problem in that a noise deterioration is caused by a color mixture between adjacent pixels for an oblique incident light. In order to suppress the color mixture, it is necessary to thin the photodiode.

In the conventional photodiode formed of Si, however, it is necessary to ensure a thickness with a junction depth of approximately 3 μm to 4 μm in the photodiode in consideration of a penetration length of an absorption of a red light in a visible light region, particularly, on a long wavelength side. For this reason, it is hard to suppress the color mixture between the adjacent pixels with respect to the oblique incident light.

DETAILED DESCRIPTION

In general, according to one embodiment, there is provided a solid state imaging device including a photoelectric converting portion. The photoelectric converting portion includes a semiconductor region and a semiconductor film. The semiconductor region has a first region and a second region. The first region is of a second conductivity type. The first region is provided in a semiconductor substrate. The second region is of a first conductivity type. The first conductivity type is a different conductivity type from the second conductivity type. The second region is provided on the first region. The semiconductor film is of the second conductivity type. The semiconductor film is provided on the semiconductor region. An absorption coefficient of a material of the semiconductor film to a visible light is higher than an absorption coefficient of a material of the semiconductor substrate to the visible light. A thickness of the semiconductor film is smaller than a thickness of the semiconductor region.

Exemplary embodiments of a solid state imaging device will be explained below in detail with reference to the accompanying drawings. The present invention is not limited to the following embodiments.

First Embodiment

Figure 1:
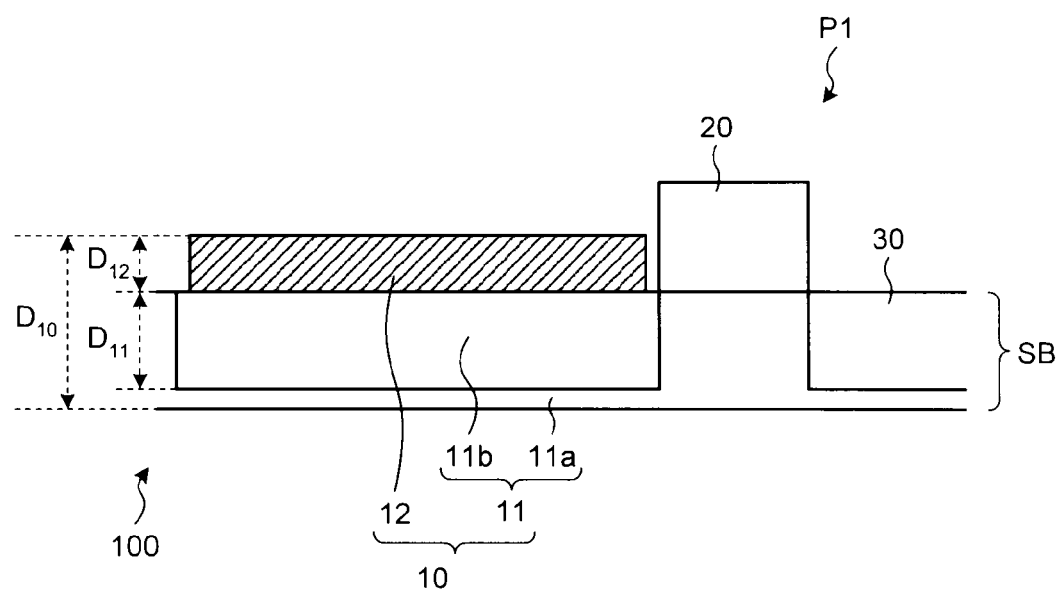
FIG. 1 is a view illustrating a structure of a solid state imaging device according to a first embodiment.

A solid state imaging device 100 according to a first embodiment will be described with reference to FIG. 1. FIG. 1 is a view illustrating a sectional structure corresponding to one pixel in the solid state imaging device 100.

In the solid state imaging device 100, a plurality of pixels is arranged in one-dimensionally or two-dimensionally. As an example, a pixel P1 will be described below.

The pixel P1 of the solid state imaging device 100 includes a photoelectric converting portion 10, a gate electrode 20, and a floating diffusion 30.

The photoelectric converting portion 10 has a semiconductor region 11 provided in a semiconductor substrate SB and a semiconductor film 12 of a second conductivity type (for example, a P type) which is provided on the semiconductor substrate SB. The semiconductor region 11 has a first region 11a of the second conductivity type (for example, a P type) and a second region 11b of a first conductivity type (for example, an N type). The first conductivity type is opposite to the second conductivity type. The photoelectric converting portion 10 is a photodiode, for example.

The semiconductor region 11 is provided in the semiconductor substrate SB. The first region 11a is formed by a first semiconductor containing an impurity of the second conductivity type (for example, the P type) in a low concentration. The P-type impurity is boron, for example. The second region 11b is formed by the first semiconductor containing an impurity of the first conductivity type (for example, the N type) in a higher concentration than the concentration of the impurity of the second conductivity type in the first region 11a. The N-type impurity is phosphorus or arsenic, for example.

The semiconductor film 12 covers the semiconductor region 11 over the semiconductor substrate SB. The semiconductor film 12 is formed by a second semiconductor containing an impurity of the second conductivity type (for example, the P type) in a higher concentration than the concentration of the impurity of the second conductivity type in the first region 11a.

The photoelectric converting portion 10 carries out a photoelectric conversion over a guided light in a PN junction region, and generates an electric charge corresponding to a light and stores the electric charge in the semiconductor region 11, for example.

The gate electrode 20 is disposed in an adjacent position to the photoelectric converting portion 10 on the semiconductor substrate SB. The gate electrode 20 constitutes a transfer transistor together with the semiconductor region 11 in the photoelectric converting portion 10 and the floating diffusion 30. The transfer transistor is turned ON when a control signal having an active level is supplied to the gate electrode 20, thereby transferring the electric charge stored in (the semiconductor region 11, for example in) the photoelectric converting portion 10 to the floating diffusion 30.

The floating diffusion 30 is provided in a well region of the semiconductor substrate SB. The floating diffusion 30 is formed by the first semiconductor containing an impurity of the first conductivity type (for example, the N type) in a higher concentration than the concentration of the impurity of the second conductivity type in the well region. The floating diffusion 30 converts, into a voltage, the electric charge transferred by the transfer transistor. An amplifying transistor (not illustrated) outputs, to a signal line, a signal corresponding to the voltage thus converted.

The second semiconductor to be a material of the semiconductor film 12 has a higher absorption coefficient to a visible light than that of the first semiconductor to be the material of the semiconductor substrate SB. In other words, an absorption coefficient of the material of the semiconductor film 12 to the visible light is higher than that of the material of the semiconductor substrate SB to the visible light.

Figure 13:
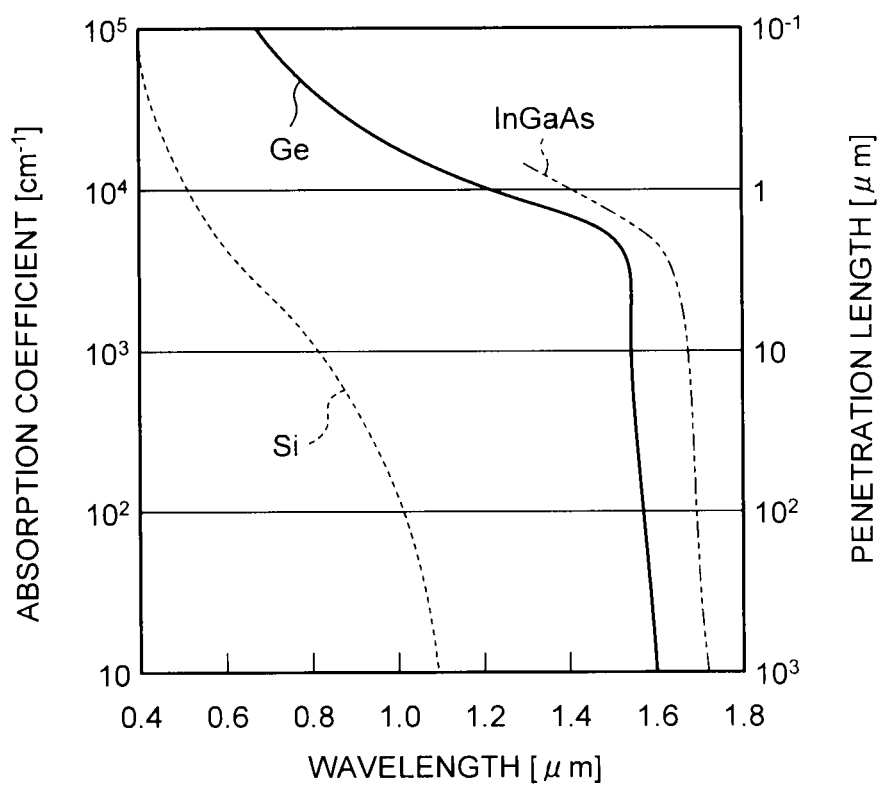
FIG. 13 is a chart illustrating a relationship between a wavelength of a light, and an absorption coefficient and penetration length.

For example, the semiconductor substrate SB is mainly composed of a material containing Si and the semiconductor film 12 is mainly composed of a material containing $Si_{1-x}Ge_x$ ($0<x\le 1$). For example, it is predicted that the absorption coefficient of the semiconductor film 12 has a value between an absorption coefficient of Si shown in a broken line and that of Ge shown in a solid line in FIG. 13 if Si is selected as the material of the semiconductor substrate SB and $Si_{1-x}Ge_x$ ($0<x<1$) is selected as the material of the semiconductor film 12. For this reason, the absorption coefficient of the material of the semiconductor film 12 to the visible light is higher than that of the material of the semiconductor substrate SB to the visible light. Alternatively, if Si is selected as the material of the semiconductor substrate SB and Ge is selected as the material of the semiconductor film 12, for example, the absorption coefficient of the material of the semiconductor film 12 to the visible light is further higher than that of the material of the semiconductor substrate SB to the visible light because the absorption coefficient of Ge shown in the solid line is higher than that of Si shown in the broken line in FIG. 13.

In the case in which Si is selected as the material of the semiconductor substrate SB and Ge or $Si_{1-x}Ge_x$ ($0<x\le 1$) is selected as the material of the semiconductor film 12, it is possible to set a thickness D12 of the semiconductor film 12 to be approximately 0.1 μm to 0.5 μm, to set a depth D11 of the second region 11b to be approximately 1.0 μm and to set a thickness D10 of the whole photoelectric converting portion 10 to be equivalent to or smaller than 1.5 μm (approximately 1.1 μm to 1.5 μm) while ensuring a photoelectric conversion efficiency satisfying a demand, for example. The reason is that the absorption coefficient of Ge or $Si_{1-x}Ge_x$ ($0<x<1$) is higher than that of Si and a light absorption depth is approximately equivalent to or smaller than 0.1 μm, and a light having a long wavelength (for example, a red light) in the visible light region (a wavelength of 400 nm to 700 nm) can be absorbed (see FIG. 13). Moreover, the reason is that Si can absorb a light having a short or middle wavelength (for example, a blue light or a green light) in the visible light region (the wavelength of 400 nm to 700 nm) in a light absorption depth of approximately 1.0 μm or less (see FIG. 13).

Figure 4A:
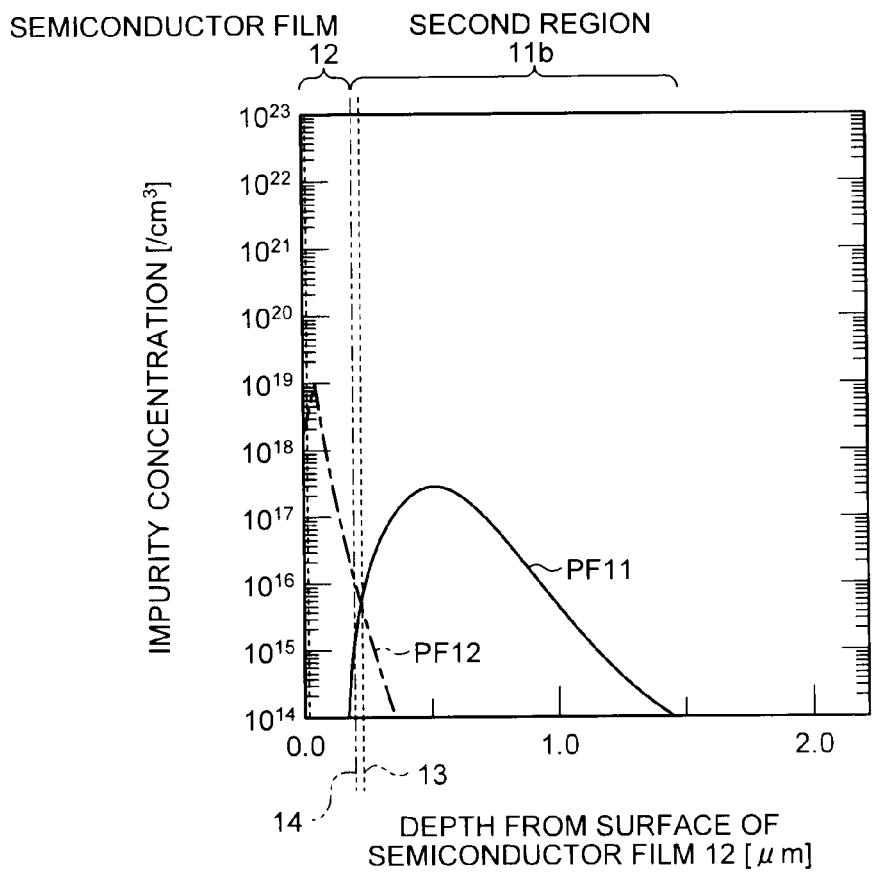
FIGS. 4A and 4B are charts illustrating a structure of a photoelectric converting portion according to the first embodiment.

In the case in which a material mainly containing Si is selected as the material of the semiconductor substrate SB and a material mainly containing $Si_{1-x}Ge_x$ ($0<x\le 1$) is selected as the material of the semiconductor film 12, moreover, the photoelectric converting portion 10 has an impurity profile illustrated in FIG. 4A. In other words, an impurity profile PF12 of the impurity of the second conductivity type (for example, the P type) which is mainly contained in the semiconductor film 12 of the second conductivity type and an impurity profile PF11 of the impurity of the first conductivity type (for example, the N type) which is mainly contained in the second region 11b of the first conductivity type intersect with each other on the second region 11b side from an interface 14 between the semiconductor film 12 and the second region 11b as shown in a two-dotted chain line. Consequently, the photoelectric converting portion 10 has a PN junction interface 13 shown in a broken line on the second region 11b side from the interface 14 between the semiconductor film 12 and the second region 11b.

Furthermore, the impurity profile PF12 of the impurity of the second conductivity type has a sharp peak in the vicinity of a surface of the semiconductor film 12 and has the impurity concentration reduced rapidly toward the interface 14 between the semiconductor film 12 and the second region 11b. At this time, it is preferable that the concentration of the impurity of the second conductivity type in the interface 14 between the semiconductor film 12 and the second region 11b should be equivalent to or lower than $1\times 10^{17}/cm^3$.

Figure 12A:
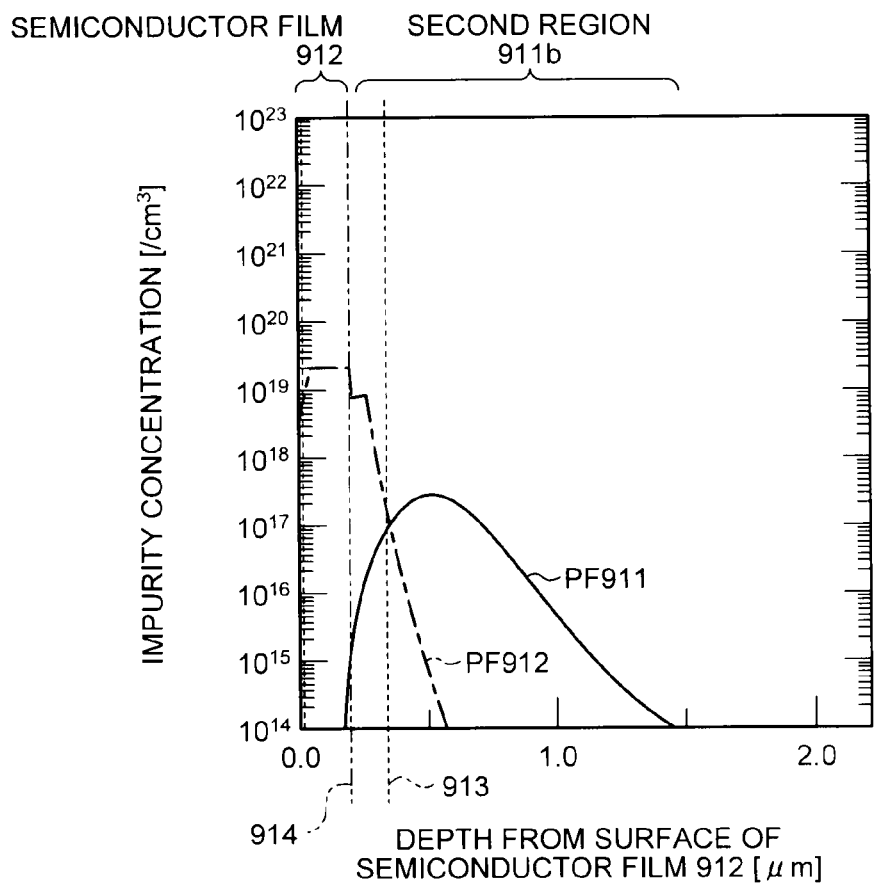
FIGS. 12A and 12B are charts illustrating a structure of a photoelectric converting portion according to another comparative example.
Figure 12B:
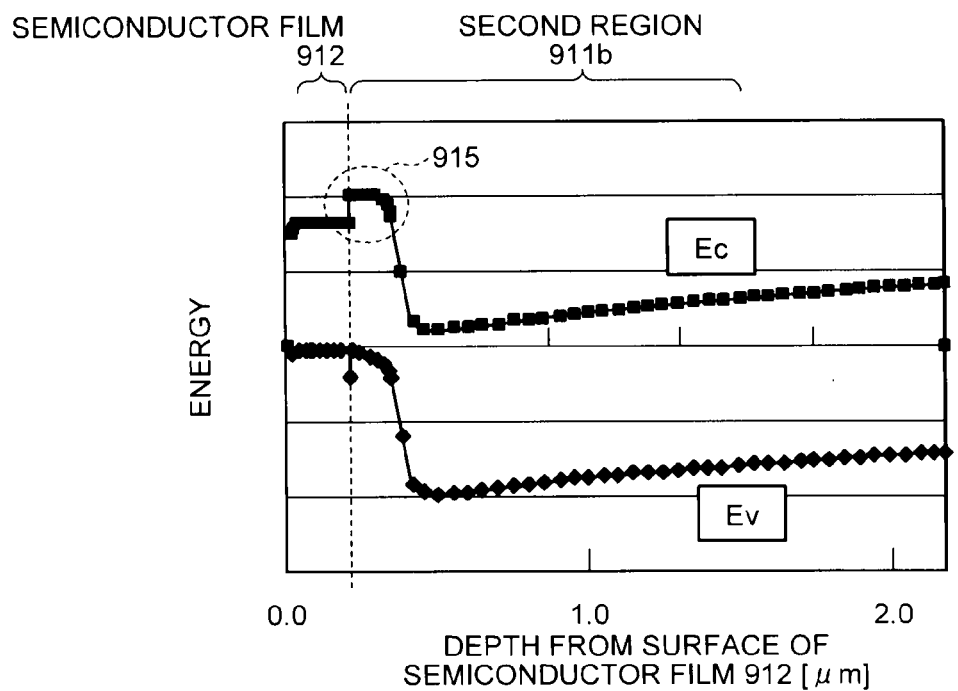

If the concentration of the impurity of the second conductivity type in an interface 914 between a semiconductor film 912 and a second region 911b is higher than $1\times 10^{17}/cm^3$ as illustrated in FIG. 12A, a protruded energy barrier 915 illustrated in FIG. 12B tends to be generated on an Ec (conduction) band side in the vicinity of the interface between the semiconductor film 912 and the second region 911b in an energy band structure. There is a high possibility that the energy barrier 915 might prevent a separation of an electron-hole pair generated by a photoelectric conversion in the vicinity of the interface between the semiconductor film 912 and the semiconductor region 911, thereby recombining the electron-hole pair. Consequently, there is a tendency that a collection efficiency, that is, a quantum efficiency of an electric charge (an electron) is deteriorated.

Next, a method of manufacturing the solid state imaging device 100 will be described with reference to FIGS. 2A to 3C. FIGS. 2A to 3C are sectional views illustrating the steps in the method of manufacturing the solid state imaging device 100. Description will be given below by taking, as an example, the case in which the semiconductor substrate SB is mainly composed of a material containing Si and the semiconductor film 12 is mainly composed of a material containing $Si_{1-x}Ge_x$ ($0<x\le 1$).

Figure 2A:
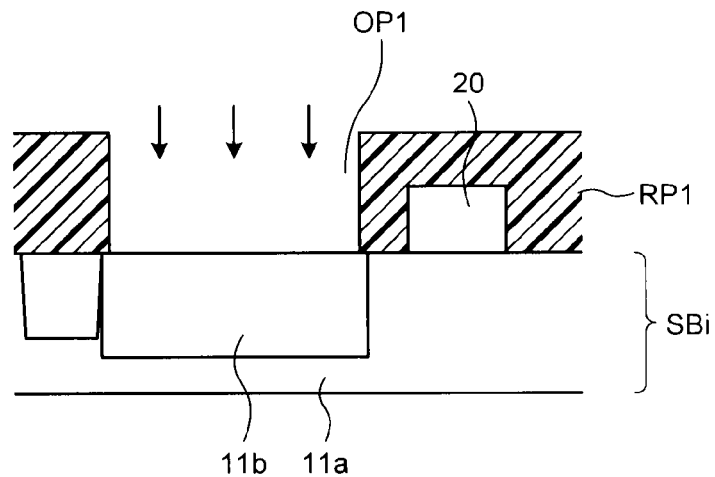
FIGS. 2A to 3C are views illustrating a method of manufacturing the solid state imaging device according to the first embodiment.

At the step illustrated in FIG. 2A, an element isolation region and the gate electrode 20 for a transistor are formed on a semiconductor substrate SBi including the first region 11a by a CMOS process. The gate electrode 20 is formed of polysilicon, for example. Then, a resist pattern RP1 having an opening pattern OP1 in a region in which the second region 11b is to be formed is provided on the semiconductor substrate SBi and the gate electrode 20. Thereafter, an impurity of a first conductivity type (for example, phosphorus or arsenic to be an N-type impurity) is introduced into the semiconductor substrate SBi by using the resist pattern RP1 as a mask through an ion implantation process or the like, and activation annealing is thus carried out. Consequently, the first region 11a of the semiconductor substrate SBi is left and the second region 11b is formed on the first region 11a. A depth of the second region 11b through the ion implantation or the like in this case is set to be approximately 1 µm. The reason is that the absorption of blue and green colors is to be enabled in an Si region.

Figure 2B:
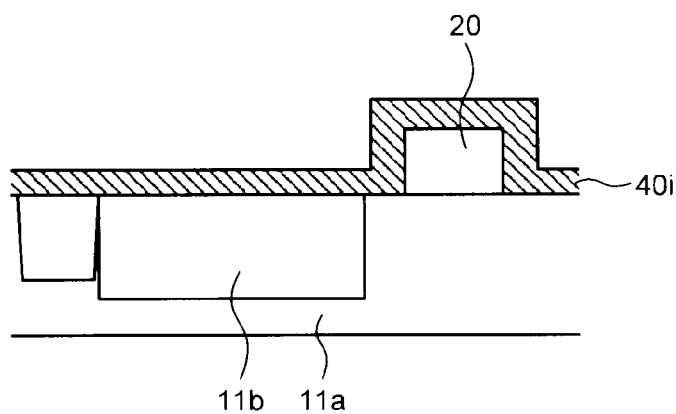

At the step illustrated in FIG. 2B, a mask layer 40i to be a mask for selectively growing the semiconductor film 12 is deposited. It is sufficient that the mask layer 40i is composed of insulating materials, for example, $SiO_2$ or SiN.

Figure 2C:
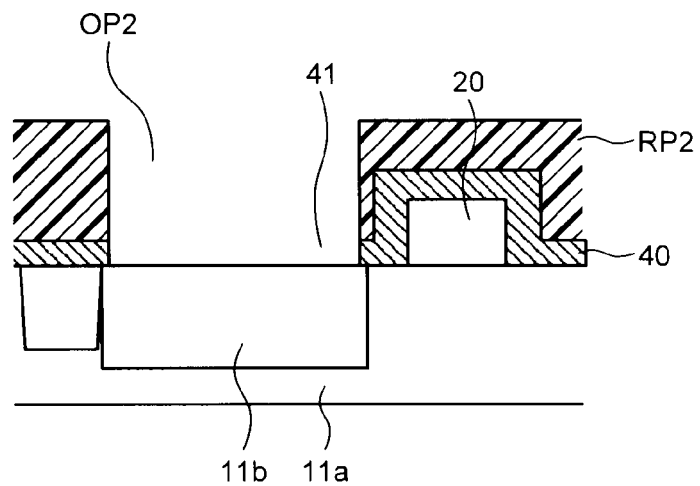

At the step illustrated in FIG. 2C, a resist pattern RP2 having an opening pattern OP2 in a region corresponding to the second region 11b is formed on the mask layer 40i. The resist pattern RP2 is set as a mask to carry out etching over the mask layer 40i through a dry etching method using RIE or the like. Consequently, an opening 41 is formed on a mask layer 40. Then, the resist pattern RP2 is removed and the surface of the semiconductor region 11 exposed through the opening 41 of the mask layer 40 is cleaned with hydrofluoric acid or the like.

Figure 3A:
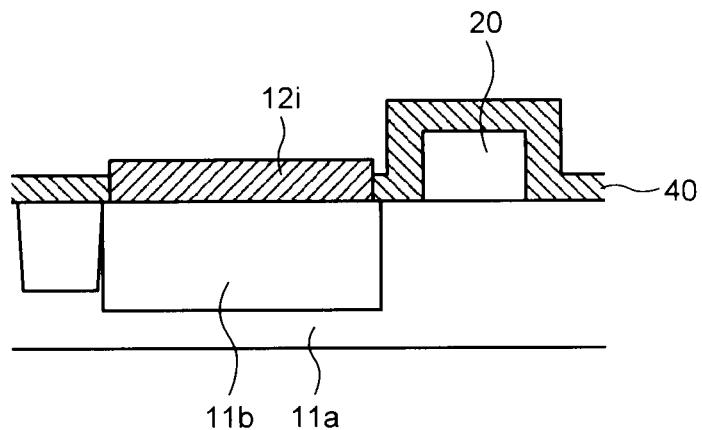

At the step illustrated in FIG. 3A, a semiconductor film 12i is grown from a region exposed through the opening 41 of the mask region 40 on the surface of the second region 11b by an epitaxial process or the like. A growing film thickness of the semiconductor film 12i is set to be approximately 0.1 µm to 0.5 µm, for example.

In the case in which $Si_{1-x}Ge_x$ (0<x<1) is selected as the material of the semiconductor film 12i, for example, a mixed gas of an Si-based gas (for example, a silane gas) and a Ge-based gas is used. At this time, a flow ratio of the Si-based gas to the Ge-based gas is regulated depending on a composition ratio of $Si_{1-x}Ge_x$ (0<x<1) to be formed. In the case in which Ge is selected as the material of the semiconductor film 12i, for example the Ge-based gas is used.

Figure 3B:
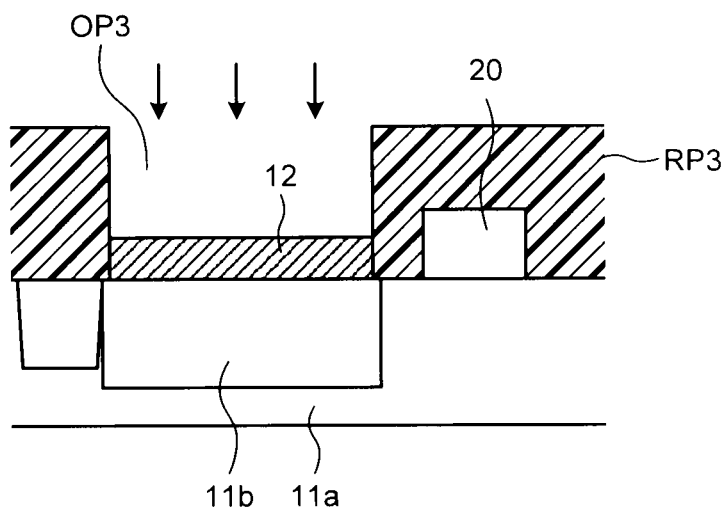

At the step illustrated in FIG. 3B, the mask layer 40 is removed by a wet etching process or the like. Then, a resist pattern RP3 having an opening pattern OP3 in a region corresponding to the semiconductor film 12i is formed on the semiconductor substrate SBi and the gate electrode 20. Therefore, the resist pattern RP3 is used as a mask to introduce an impurity of the second conductivity type (for example, boron to be a P-type impurity) into the semiconductor film 12i by an ion implantation process or the like, thereby carrying out the activity annealing. Consequently, the semiconductor film 12 of the second conductivity type is formed.

At this time, each of conditions of the ion implantation and the activation annealing is regulated in a manner such that the concentration of the impurity of the second conductivity type on an interface between the semiconductor film 12 and the second region lib is equivalent to or lower than $1 \times 10^{17}/cm^3$. In other words, an ion implantation in a low acceleration and a heat treatment in a short time are carried out in such a manner that the impurity profile PF12 having a sharp peak in the vicinity of the surface of the semiconductor film 12 illustrated in FIG. 4A can be obtained. For example, in the ion implantation, an acceleration voltage is set to be 2 kV to 10 kV and a dose is set to be equivalent to or smaller than $1 \times 10^{14}$. In the case in which the activation annealing is carried out by an RTA process and $Si_{1-x}Ge_x$ (0<x<1) is selected as the material of the semiconductor film 12, for example, the heat treatment is performed at 1000° C. for 10 seconds or less. In the case in which Ge is selected as the material of the semiconductor film 12, alternatively, the heat treatment is carried out at 850° C. for 10 seconds or less.

Figure 3C:
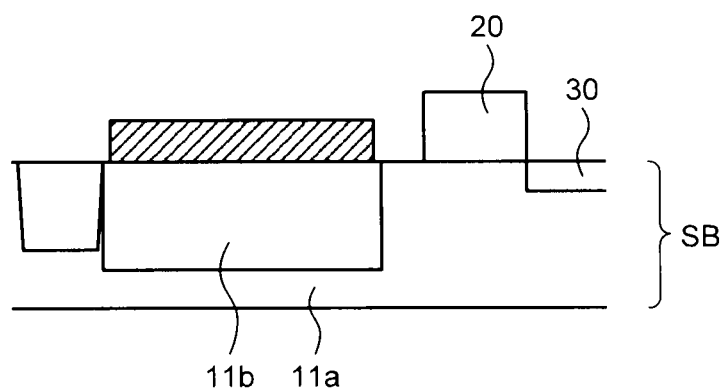

At the step illustrated in FIG. 3C, a diffusion layer region (N+) such as the floating diffusion 30 is formed.

Thus, the solid state imaging device 100 can be manufactured.

In addition, a necessary implantation is properly carried out, which is not illustrated in the drawings. The photoelectric converting portion 10 can be thinned. Therefore, it is possible to decrease the number of the necessary implantations in a semiconductor region for an inter-pixel isolation or the like.

Moreover, the mask layer may be of a lamination type having a combination of $SiO_2$ or SiN to properly carry out an etching treatment, resulting in a formation of an opening to be a mask.

Furthermore, there is no problem even if order of the formation of the photoelectric converting portion 10 and that of the transistor region such as the gate electrode 20 or the floating diffusion 30 is exchanged properly, and it is a matter of course that the order is not restricted to the embodiment.

Figure 5A:
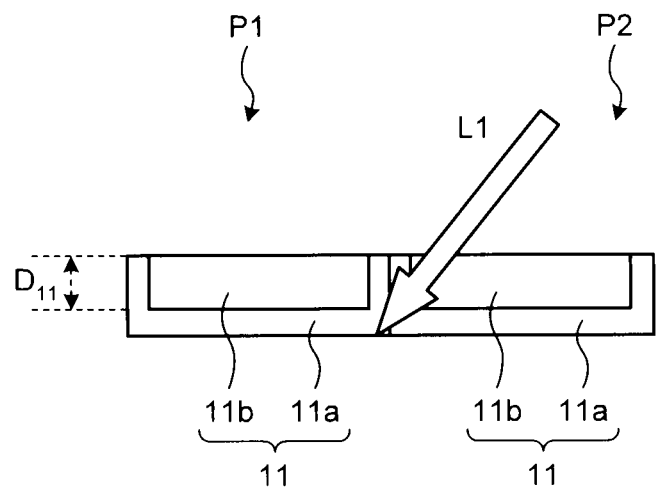
FIGS. 5A and 5B are views for explaining an effect obtained by the first embodiment.
Figure 5B:
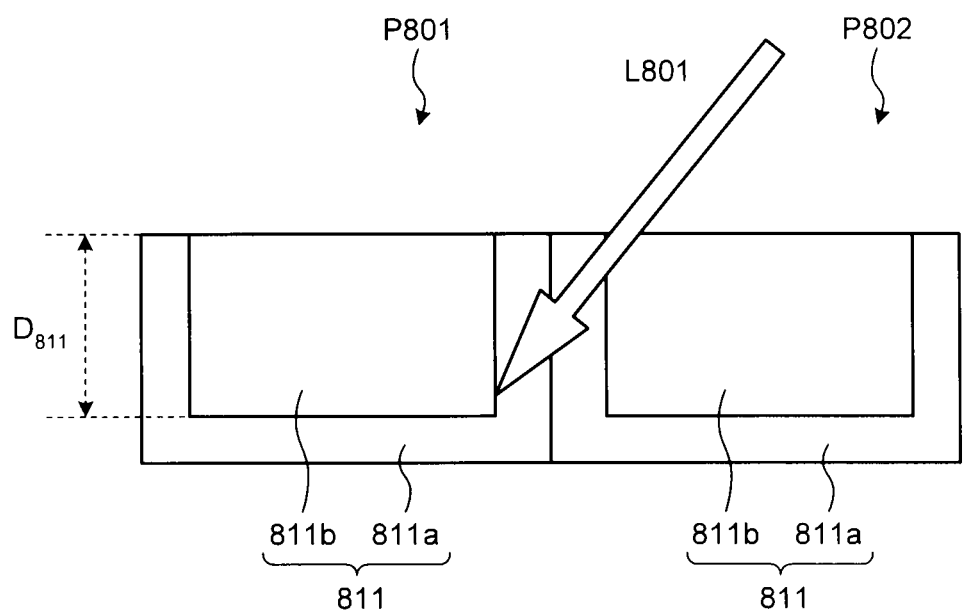
Figure 11:
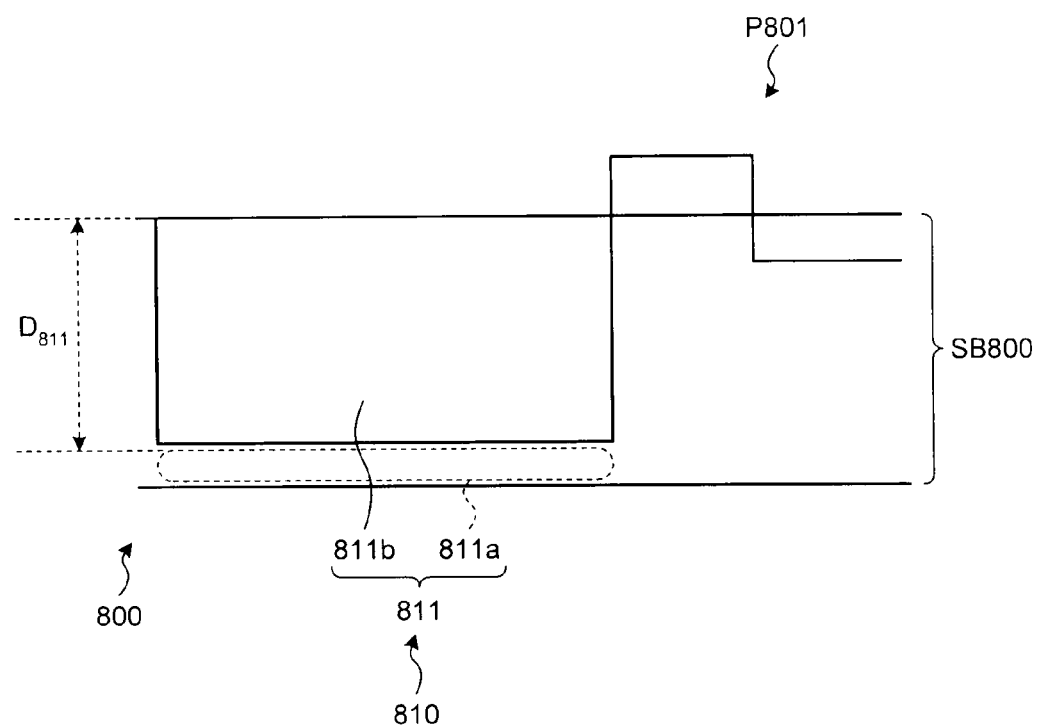
FIG. 11 is a view illustrating a structure of a solid state imaging device according to a comparative example.

There will be considered, as a comparative case, a case in which a photoelectric converting portion 810 does not have the semiconductor film 12 (see FIG. 1) composed of a material having a higher absorption coefficient with respect to a visible light than a semiconductor substrate SB800, as shown in FIG. 11. In this case, the photoelectric converting portion 810 has, as the semiconductor region 811 for carrying out a photoelectric conversion, a second region 811b of a first conductivity type which is disposed on a surface side in the semiconductor substrate SB800 and a first region 811a of a second conductivity type which is disposed on a back surface side of the second region 811b in the semiconductor substrate SB800. At this time, a junction depth D811 of the second region 811b should be set to be approximately 3 µm to 4 µm in consideration of a penetration length of an absorption of a red light on a long wavelength side, particularly, in a visible light region. For this reason, for example, an oblique incident light L801 which is incident on an adjacent pixel P802 to a pixel P801 passes through the second region 811b of the adjacent pixel P802 and reaches the second region 811b of the pixel P801 as illustrated in FIG. 5B. Therefore, a mixed color tends to be generated between the pixels P801 and P802 due to the oblique incident light. In other words, it is hard to suppress the mixed color between the adjacent pixels with respect to the oblique incident light.

Meanwhile, in the first embodiment, the semiconductor film 12 covers the second region 11b on the semiconductor substrate SB. An absorption coefficient of the material of the semiconductor film 12 with respect to the visible light is higher than that of the material of the semiconductor substrate SB with respect to the visible light. Consequently, it is possible to reduce the depth of the second region 11b while ensuring a photoelectric conversion efficiency to satisfy a demand. For example, in the case in which Si is selected as the material of the semiconductor substrate SB and Ge or $Si_{1-x}Ge_x$ (0<x<1) is selected as the material of the semiconductor film 12, it is possible to set a thickness D12 of the semiconductor film 12 to be approximately 0.1 µm to 0.5 µm, to set a depth D11 of the second region 11b to be approximately 1.0 µm and to set a thickness D10 of the whole photoelectric converting portion 10 to be equivalent to or smaller than 1.5 µm (approximately 1.1 µm to 1.5 µm), that is, to be equivalent to or smaller than a half of the junction depth D811 of the second region 811 while ensuring a photoelectric conversion efficiency to satisfy a demand. Consequently, for example, the oblique incident light L1 which is incident on the adjacent pixel P2 to the pixel P1 reaches the second region 11 of the pixel P1 with difficulty even if it passes through the second region 11b of the adjacent pixel P2 as illustrated in FIG. 5A.

For this reason, it is hard for the mixed color to be generated between the pixels P1 and P2 due to the oblique incident light. In other words, it is possible to suppress the mixed color between the adjacent pixels with respect to the oblique incident light.

Moreover, it is possible to reduce the depth D11 of the second region 11b to store an electric charge therein. Therefore, the semiconductor region for an inter-pixel isolation to reduce a leakage to the adjacent pixel of the electric charge stored in the second region 11b may be shallow. In other words, it is possible to reduce the number of ion implantations for forming the semiconductor region for the inter-pixel isolation. Consequently, it is possible to reduce a manufacturing cost of the solid state imaging device 100.

In the first embodiment, moreover, the photoelectric converting portion 10 has the PN junction interface 13 on the second region 11b side from the interface 14 between the semiconductor film 12 and the second region 11b (see FIG. 4A). Consequently, an electric charge generated by a photoelectric conversion is trapped with difficulty through dangling bond on the surface of the semiconductor substrate SB so that a dark current can be reduced.

Alternatively, there will be considered, as a comparative case, a case in which the concentration of the impurity of the second conductivity type in the interface 914 between the semiconductor film 912 and the semiconductor region 911 is higher than $1 \times 10^{17}$ cm$^3$, as illustrated in FIG. 12A. In other words, attention will be paid to the impurity profile PF912 of the second conductivity type in the impurity profile PF911 of the first conductivity type and the impurity profile PF912 of the second conductivity type illustrated in FIG. 12A. The concentration of the impurity of the second conductivity type in the interface 914 is approximately $1 \times 10^{19}$/cm$^3$, for example. In this case, the protruded energy barrier 915 illustrated in FIG. 12B tends to be generated on the Ec (conduction) band side in the vicinity of the interface between the semiconductor film 912 and the semiconductor region 911 in the energy band structure of the photoelectric converting portion. There is a high possibility that the energy barrier 915 might inhibit a separation of an electron-hole pair generated by the photoelectric conversion in the vicinity of the interface between the semiconductor film 912 and the semiconductor region 911, resulting in a recombination of the electron-hole pair. Consequently, there is a tendency that a collection efficiency, that is, a quantum efficiency of the electric charge (electron) is reduced.

Figure 4B:
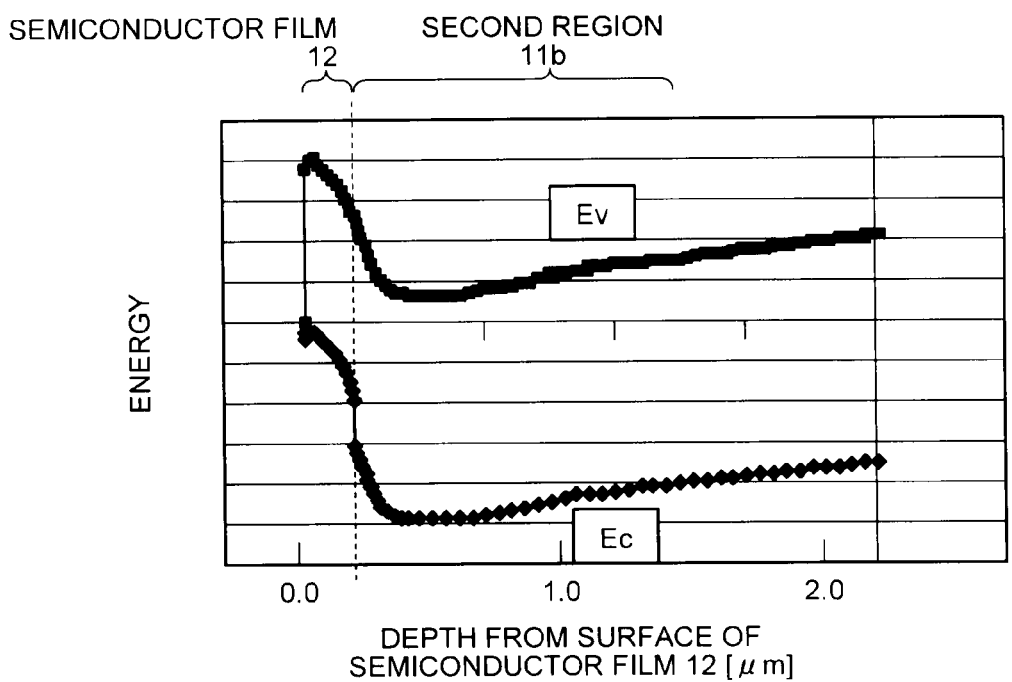

Meanwhile, in the first embodiment, in the case in which a material mainly containing Si is selected as the material of the semiconductor substrate SB and a material mainly containing $Si_{1-x}Ge_x$ (0<x≤1) is selected as the material of the semiconductor film 12, the concentration of the impurity of the second conductivity type in the interface 14 between the semiconductor film 12 and the second region 11b is equivalent to or lower than $1 \times 10^{17}$ cm$^3$. More specifically, attention will be paid to the impurity profile PF12 of the second conductivity type in the impurity profile PF11 of the first conductivity type and the impurity profile PF12 of the second conductivity type illustrated in FIG. 4A. The concentration of the impurity of the second conductivity type in the interface 14 between the semiconductor film 12 and the second region 11b is approximately $1 \times 10^{16}$ cm$^3$, for example. As illustrated in FIG. 4B, consequently, it is possible to reduce an energy density in the vicinity of the interface 14 between the semiconductor film 12 and the second region 11b, resulting in prevention of the generation of the protruded energy barrier 915 (see FIG. 12B). Thus, it is possible to easily separate the electron-hole pair generated by the photoelectric conversion in the vicinity of the interface 14 between the semiconductor film 12 and the second region 11b. As a result, it is possible to suppress the reduction in the quantum efficiency.

It should be noted that, although the description has been given by taking, as an example, the case in which the first conductivity type is the N type and the second conductivity type is the P type in the first embodiment, the first conductivity type may be the P type and the second conductivity type may be the N type.

Moreover, the semiconductor substrate SB may be mainly composed of a material containing Ge and the semiconductor film 12 may be composed of a material containing $Ge_{1-y}(InGaAs)_y$ (0<y≤1). For example, if Ge is selected as the material of the semiconductor substrate SB and $Ge_{1-y}(InGaAs)_y$ (0<y<1) is selected as the material of the semiconductor film 12, it is anticipated that an absorption coefficient has a value between an absorption coefficient of Ge shown in a solid line and an absorption coefficient of InGaAs shown in a one-dotted chain line in FIG. 13. Therefore, an absorption coefficient of the material of the semiconductor film 12 with respect to a visible light is higher than that of the material of the semiconductor substrate SB with respect to the visible light. Alternatively, if Ge is selected as the material of the semiconductor substrate SB and InGaAs is selected as the material of the semiconductor film 12, for example, the absorption coefficient of the material of the semiconductor film 12 with respect to the visible light is further higher than that of the material of the semiconductor substrate SB with respect to the visible light because the absorption coefficient of InGaAs shown in the one-dotted chain line is higher than that of Ge shown in the solid line in FIG. 13.

In the method of manufacturing the solid state imaging device 100, at the step illustrated in FIG. 3B, plasma doping for introducing the impurity of the second conductivity type into the semiconductor film 12 by using a plasma may be carried out in order to obtain the impurity profile PF12 having a sharp peak in the vicinity of the surface of the semiconductor film 12 as illustrated in FIG. 4A.

Alternatively, it is also possible to grow the semiconductor film 12i while introducing the impurity of the second conductivity type into the semiconductor film 12i in-situ at the step illustrated in FIG. 3A in place of the introduction of the impurity at the step illustrated in FIG. 3B. For example, in the case in which $Si_{1-x}Ge_x$ (0<x<1) is selected as the material of the semiconductor film 12i, an epitaxial growth is carried out by using a mixed gas of an Si-based gas (for example, a silane gas), a Ge-based gas and a gas for introducing the impurity of the first conductivity type in-situ. At this time, a flow ratio of the Si-based gas to the Ge-based gas is regulated depending on a composition ratio of $Si_{1-x}Ge_x$ (0<x<1) to be formed. In the case in which Ge is selected as the material of the semiconductor film 12i, for example, the epitaxial growth is carried out by using a mixed gas of the Ge-based gas and the gas for introducing the impurity of the first conductivity type in-situ.

Second Embodiment

Figure 6:
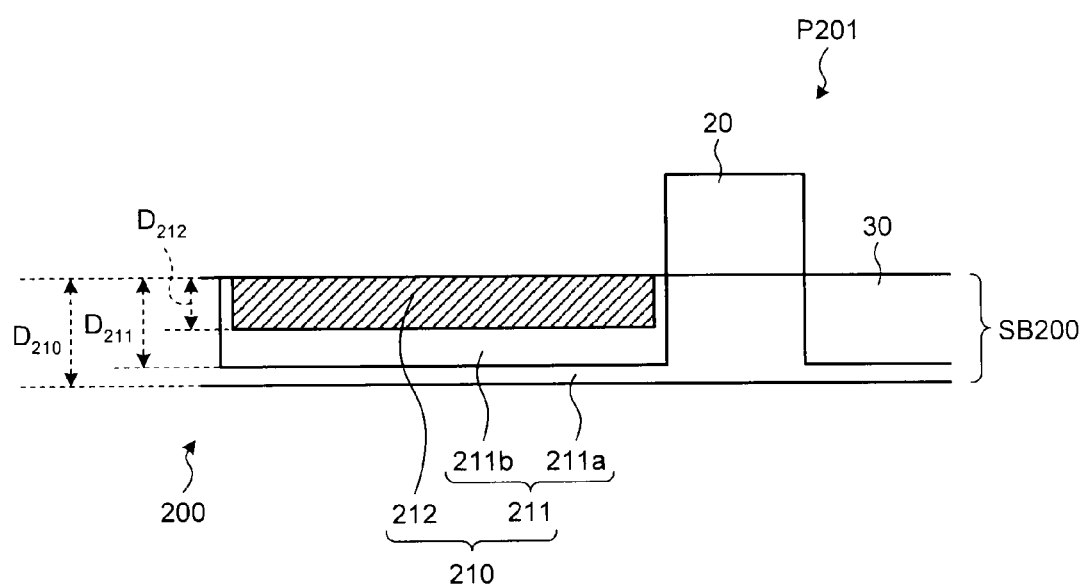
FIG. 6 is a view illustrating a structure of a solid state imaging device according to a second embodiment.

Next, a solid state imaging device 200 according to a second embodiment will be described with reference to FIG. 6. Different portions from those in the first embodiment will mainly be described below.

The second embodiment is different from the first embodiment in that a semiconductor film 212 in a photoelectric converting portion 210 of a pixel P201 in the solid state imaging device 200 is embedded in a surface of a semiconductor region 211. At this time, a depth D211 of a second region 211b can be set to include a thickness D212 of the semiconductor film 212. For example, in the case in which Si is selected as a material of a semiconductor substrate SB200 containing a first region 211a and the second region 211b and Ge or $Si_{1-x}Ge_x$ (0<x≤1) is selected as a material of the semiconductor film 212, it is possible to set the thickness D212 of the semiconductor film 212 to be approximately 0.1 μm to 0.5 μm, to set the depth D211 of the second region 211b to be approximately 1.0 μm and to set a thickness D210 of the whole photoelectric converting portion 210 to be approximately 1.0 μm while ensuring a photoelectric conversion efficiency to satisfy a demand.

Figure 7A:
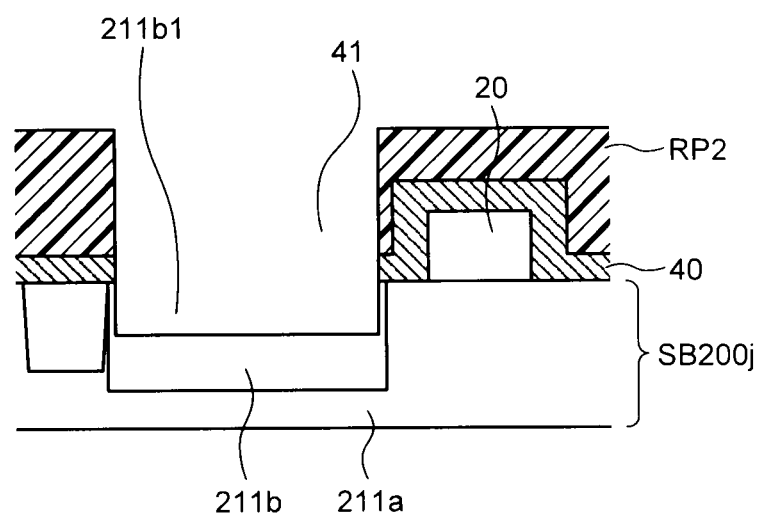
FIGS. 7A and 7B are views illustrating a method of manufacturing the solid state imaging device according to the second embodiment.
Figure 7B:
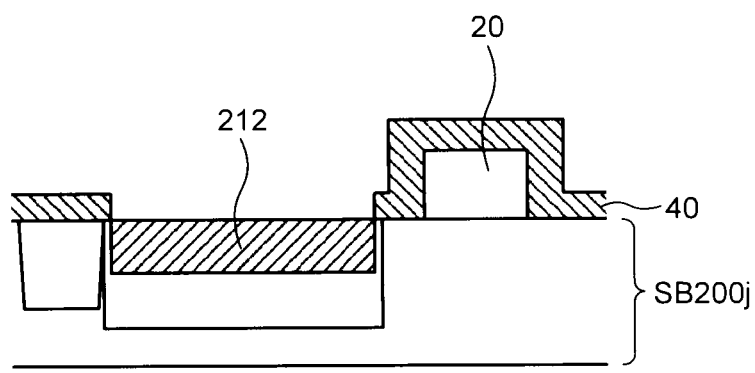

Moreover, a method of manufacturing the solid state imaging device 200 is different from that of the first embodiment as illustrated in FIGS. 7A and 7B.

A step illustrated in FIG. 7A is carried out after the step illustrated in FIG. 2C. At this step, a resist pattern RP2 is set as a mask to carry out etching for the second region 211b provided on the first region 211a in a semiconductor substrate SB200j through recess etching using RIE or the like. Consequently, a concave portion 211b1 is formed on a surface of the second region 211b. Then, the resist pattern RP2 is removed and side and bottom surfaces of the concave portion 211b1 in the semiconductor region 211 which is exposed are cleaned with hydrofluoric acid or the like. At this time, a depth of the concave portion 211b1 is set to be approximately 0.1 μm to 0.5 μm, for example, depending on the film thickness of the semiconductor film 212 to be grown.

At a step illustrated in FIG. 7B, the semiconductor film 212 is grown from the concave portion 211b1 exposed through an opening 41 of a mask layer 40 in the semiconductor region 211 by an epitaxial process or the like. A growing film thickness of the semiconductor film 212 is set to be approximately 0.1 μm to 0.5 μm, for example.

Then, processings at the same steps as in FIGS. 3B and 3C are carried out.

As described above, in the second embodiment, the thickness D212 of the semiconductor film 212 can be included in the depth D211 of the semiconductor region 211. Therefore, the thickness D210 of the whole photoelectric converting portion 210 can be reduced still more.

Third Embodiment

Figure 8:
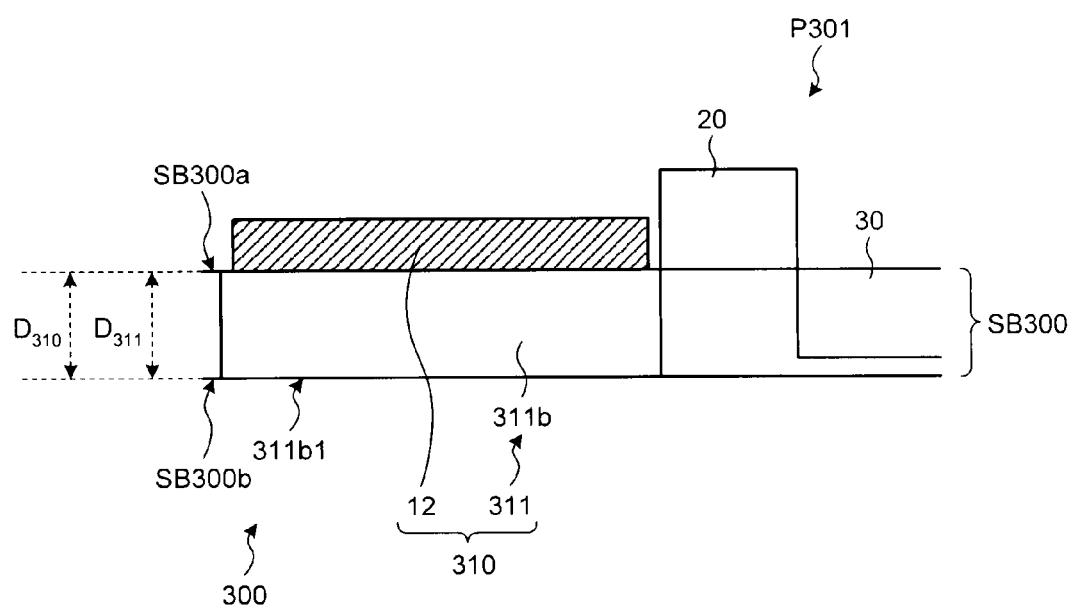
FIG. 8 is a view illustrating a structure of a solid state imaging device according to a third embodiment.

Next, a solid state imaging device 300 according to a third embodiment will be described with reference to FIG. 8. Different portions from those in the first embodiment will mainly be described below.

The third embodiment is different from the first embodiment in that a lower surface 311b1 of a second region 311b of a semiconductor region 311 in a photoelectric converting portion 310 of a pixel P301 of the solid state imaging device 300 forms a part of a back surface SB300b of a semiconductor substrate SB300. In other words, the semiconductor region 311 does not have the first region 11a (see FIG. 1) but is exposed at both sides of a surface SB300a and the back surface SB300b in the semiconductor substrate SB300. In other words, the semiconductor substrate SB300 is thinned and a thickness of the semiconductor substrate SB300 is reduced to reach a thickness D311 of the second region 311b in the semiconductor region 311. Consequently, a thickness D310 of the whole photoelectric converting portion 310 can be reduced to substantially reach the thickness D311 of the second region 311b in the semiconductor region 311.

Figure 9A:
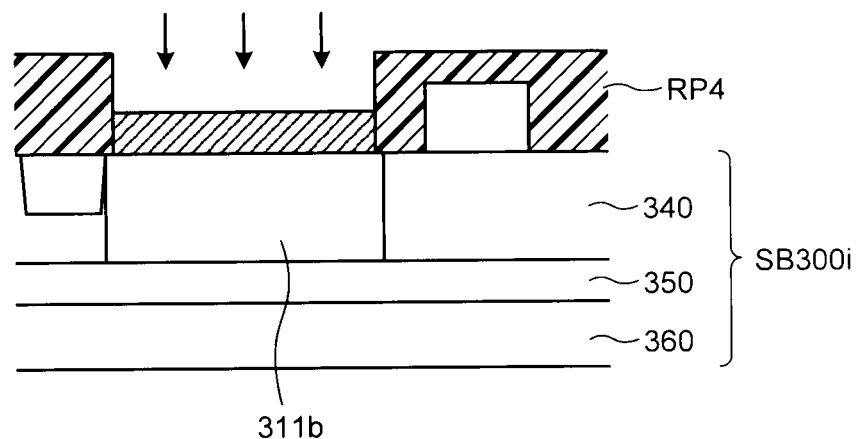
FIGS. 9A to 9C are views illustrating a method of manufacturing a solid state imaging device according to a third embodiment.
Figure 9B:
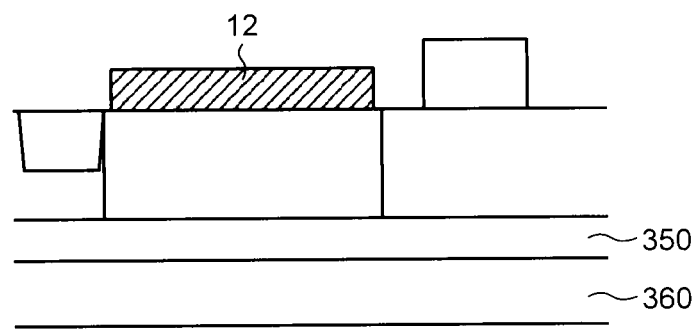
Figure 9C:
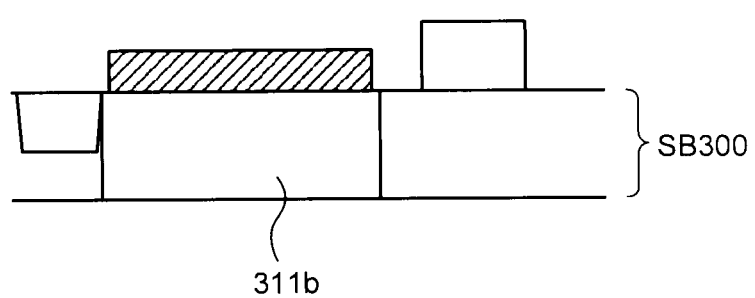

Moreover, a method of manufacturing the solid state imaging device 300 is different from that of the first embodiment as illustrated in FIGS. 9A to 9C.

At a step illustrated in FIG. 9A, an SOI substrate having an embedded oxide layer 350 and an active region 340 laminated sequentially on a ground region 360 is prepared as a semiconductor substrate SB300i. Then, a similar processing to that at the step illustrated in FIG. 2A is carried out.

At a step illustrated in FIG. 9B, similar processings to those in the steps illustrated in FIGS. 2B to 3C are carried out.

At a step illustrated in FIG. 9C, the back surface of the semiconductor substrate (SOI substrate) SB300i is polished until the embedded oxide layer 350 is removed. Consequently, the lower surface 311b1 of the second region 311b in the semiconductor region 311 is exposed so that the lower surface 311b1 of the second region 311b in the semiconductor region 311 forms a part of the back surface SB300b of the semiconductor substrate SB300.

As described above, in the third embodiment, the lower surface 311b1 of the second region 311b in the semiconductor region 311 forms a part of the back surface 300b of the semiconductor substrate SB300. In other words, the semiconductor substrate SB300 is thinned to reach the thickness D311 of the second region 311b in the semiconductor region 311. Therefore, the solid state imaging device 300 can be easily applied to a backside illumination type image sensor. Moreover, the semiconductor substrate SB300 is thinned to reach the thickness D311 of the second region 311b in the semiconductor region 311. Therefore, the solid state imaging device 300 can easily be mounted on a thin type camera module.

Fourth Embodiment

Figure 10:
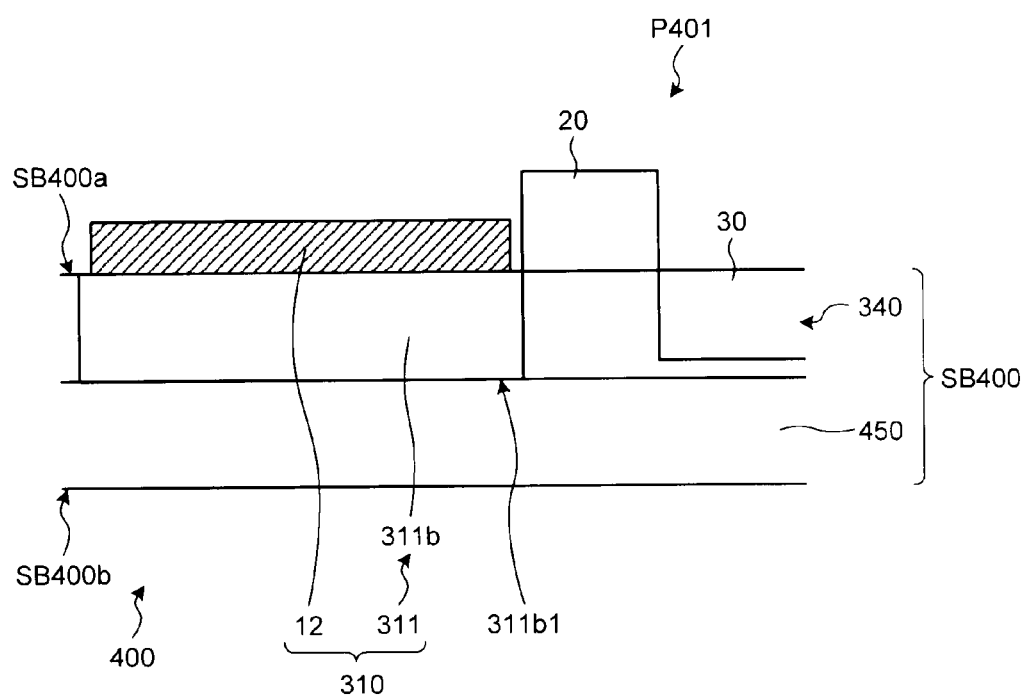
FIG. 10 is a view illustrating a structure of a solid state imaging device according to a fourth embodiment.

Next, a solid state imaging device 400 according to a fourth embodiment will be described with reference to FIG. 10. Different portions from those of the third embodiment will mainly be described below.

The fourth embodiment is different from the third embodiment in that a lower surface 311b1 of a second region 311b of a semiconductor region 311 in a photoelectric converting portion 310 of a pixel P401 of the solid state imaging device 400 is provided in contact with an embedded oxide layer 450 in a semiconductor substrate SB400. In other words, the semiconductor substrate SB400 has a surface SB400a on which an active region 340 is provided and a back surface SB400b from which the embedded oxide layer 450 is exposed. Moreover, it is possible to obtain the structure by polishing the embedded oxide layer 350 till exposure without removing the embedded oxide layer 350 at the step illustrated in FIG. 9C.

Also in the fourth embodiment, thus, the lower surface 311b1 of the second region 311b in the semiconductor region 311 is exposed to the back surface side of the semiconductor substrate SB400 through the embedded oxide layer 450. Therefore, the solid state imaging device 400 can easily be applied to a backside illumination type image sensor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging device comprising:
a photoelectric converting portion, the photoelectric converting portion including a semiconductor region and a semiconductor film, the semiconductor region having a first region and a second region, the first region being of a second conductivity type, the first region being provided in a semiconductor substrate, the second region being of a first conductivity type, the first conductivity type being a different conductivity type from the second conductivity type, the second region being provided on the first region, the semiconductor film being of the second conductivity type, the semiconductor film being provided on the semiconductor region,
wherein an absorption coefficient of a material of the semiconductor film to a visible light is higher than an absorption coefficient of a material of the semiconductor substrate to the visible light,
a thickness of the semiconductor film is smaller than a thickness of the semiconductor region, and
when seen through in a direction perpendicular to a surface of the semiconductor substrate, the semiconductor film is included within the second region.

2. A solid state imaging device comprising:
a photoelectric converting portion, the photoelectric converting portion including a semiconductor region and a semiconductor film, the semiconductor region being provided in a semiconductor substrate, the semiconductor film being provided on the semiconductor region, the photoelectric converting portion having a junction interface between a first conductivity type and a second conductivity type, the second conductivity type being a different conductivity type from the first conductivity type,
wherein an absorption coefficient of a material of the semiconductor film to a visible light is higher than an absorption coefficient of a material of the semiconductor substrate to the visible light,
a thickness of the semiconductor film is smaller than a thickness of the semiconductor region, and
when seen through in a direction perpendicular to a surface of the semiconductor substrate, the semiconductor film is included within the second region.

3. The solid state imaging device according to claim 2, wherein the junction interface between the first conductivity type and the second conductivity type is positioned on a side of the semiconductor region from an interface between the semiconductor film and the semiconductor region.

4. The solid state imaging device according to claim 1, wherein the semiconductor substrate is mainly composed of a material containing Si, and
the semiconductor film is mainly composed of a material containing $Si_{1-x}Ge_x$ ($0<x\leq1$).

5. The solid state imaging device according to claim 4, wherein a concentration of an impurity of the second conductivity type in an interface between the semiconductor film and the semiconductor region is equivalent to or lower than $1\times10^{17}/cm^3$.

6. The solid state imaging device according to claim 5, wherein an impurity profile of the impurity of the second conductivity type has a peak in the vicinity of a surface at an opposite side to the semiconductor region in the semiconductor film.

7. The solid state imaging device according to claim 2, wherein the semiconductor substrate is mainly composed of a material containing Si, and
the semiconductor film is mainly composed of a material containing $Si_{1-x}Ge_x$ ($0<x\leq1$).

8. The solid state imaging device according to claim 7, wherein an impurity profile of an impurity of the first conductivity type has a peak in the semiconductor region, and
an impurity profile of an impurity of the second conductivity type has a peak in the semiconductor film.

9. The solid state imaging device according to claim 8, wherein a concentration of an impurity of the second conductivity type in an interface between the semiconductor film and the semiconductor region is equivalent to or lower than $1\times10^{17}/cm^3$.

10. The solid state imaging device according to claim 9, wherein an impurity profile of the impurity of the second conductivity type has a peak in the vicinity of a surface at an opposite side to the semiconductor region in the semiconductor film.

11. The solid state imaging device according to claim 1, wherein the second region of the semiconductor region has a flat surface, and
the semiconductor film covers the flat surface.

12. The solid state imaging device according to claim 2, wherein the semiconductor region has a flat surface, and
the semiconductor film covers the flat surface.

13. The solid state imaging device according to claim 1, wherein the second region of the semiconductor region has a concave portion on a surface, and
the semiconductor film is embedded in the concave portion.

14. The solid state imaging device according to claim 2, wherein the semiconductor region has a concave portion on a surface, and
the semiconductor film is embedded in the concave portion.

15. The solid state imaging device according to claim 1, wherein a lower surface of the semiconductor region forms a part of a back surface of the semiconductor substrate.

16. The solid state imaging device according to claim 2, wherein a lower surface of the semiconductor region forms a part of a back surface of the semiconductor substrate.

17. The solid state imaging device according to claim 16, wherein the semiconductor region is a semiconductor region of the first conductivity type,
the semiconductor film is a semiconductor film of the second conductivity type,
an upper surface of the semiconductor region forms a part of the surface of the semiconductor substrate, and
the semiconductor film covers the upper surface of the semiconductor region.

18. The solid state imaging device according to claim 1, wherein the semiconductor substrate has the surface on which an active region is provided and a back surface from which an embedded oxide layer is exposed,
the semiconductor region is provided in the active region, and
a lower surface of the semiconductor region is provided in contact with the embedded oxide layer.

19. The solid state imaging device according to claim 2, wherein the semiconductor substrate has the surface on which an active region is provided and a back surface from which an embedded oxide layer is exposed,
the semiconductor region is provided in the active region, and
a lower surface of the semiconductor region is provided in contact with the embedded oxide layer.

20. The solid state imaging device according to claim 19, wherein the semiconductor region is a semiconductor region of the first conductivity type,
 the semiconductor film is a semiconductor film of the second conductivity type,
 an upper surface of the semiconductor region forms a part of the surface of the semiconductor substrate, and
 the semiconductor film covers the upper surface of the semiconductor region.

* * * * *